United States Patent
Lin et al.

(10) Patent No.: US 9,773,922 B1
(45) Date of Patent: Sep. 26, 2017

(54) MEMORY DEVICE

(71) Applicant: UNITED MICROELECTRONICS CORP., Hsin-Chu (TW)

(72) Inventors: Po-Hsieh Lin, Tainan (TW); Chia-Fu Hsu, Tainan (TW); Bei-Zhun Syu, Taitung County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/336,819

(22) Filed: Oct. 28, 2016

(51) Int. Cl.
| | |
|---|---|
| H01L 27/115 | (2017.01) |
| H01L 29/792 | (2006.01) |
| H01L 29/10 | (2006.01) |
| H01L 29/78 | (2006.01) |
| H01L 27/1158 | (2017.01) |

(52) U.S. Cl.
CPC ........ H01L 29/792 (2013.01); H01L 29/1037 (2013.01); H01L 29/7827 (2013.01); H01L 27/1158 (2013.01); H01L 29/7926 (2013.01)

(58) Field of Classification Search
CPC ................. H01L 27/1158; H01L 29/7926
USPC .................... 257/330; 438/156, 268
See application file for complete search history.

(56) References Cited

U.S. PATENT DOCUMENTS

| | | | |
|---|---|---|---|
| 7,038,271 B2 | 5/2006 | Nomoto et al. | |
| 7,538,371 B2 | 5/2009 | Yang | |
| 7,663,185 B2 * | 2/2010 | Chen | H01L 29/66795 257/329 |
| 2004/0108545 A1* | 6/2004 | Ando | H01L 21/26586 257/329 |
| 2007/0161193 A1* | 7/2007 | Hsu | G11C 16/0475 438/259 |
| 2011/0227162 A1* | 9/2011 | Lin | H01L 21/823412 257/368 |
| 2014/0131791 A1* | 5/2014 | Masuoka | H01L 29/66666 257/329 |
| 2015/0263122 A1* | 9/2015 | Hsiao | H01L 29/515 257/401 |
| 2016/0071965 A1* | 3/2016 | Afzalian | H01L 29/165 257/12 |
| 2016/0093611 A1* | 3/2016 | Cheng | H01L 27/088 257/329 |
| 2016/0211369 A1* | 7/2016 | Jan | H01L 27/12 |
| 2016/0218218 A1* | 7/2016 | Zhu | H01L 29/7855 |

OTHER PUBLICATIONS

Wingyu Leung, Title: The Ideal SoC Memory: 1T-SRAM, 2000, IEEE.
Jin-Woo Han, Title: A Novel Bi-stable 1-Transistor SRAM for High Density Embedded Applications, 2015, IEEE.
Peter N. Glaskowsky, Title: MoSys Explains 1T-SRAM Technology, Microprocessor Report, vol. 13, No. 12, Sep. 13, 1999.

(Continued)

Primary Examiner — George Fourson, III
(74) Attorney, Agent, or Firm — Winston Hsu

(57) ABSTRACT

A memory device includes: a substrate; a channel layer on the substrate, in which the channel layer includes a T-shape having a horizontal portion with a first end and a second end and a vertical portion having a third end; a gate structure on a side of the vertical portion; an oxide-nitride-oxide (ONO) layer between the gate structure and the vertical portion; a source region on the first end of the horizontal portion; and a drain region on the third end of the vertical portion.

20 Claims, 3 Drawing Sheets

(56) References Cited

OTHER PUBLICATIONS

Jin-Woo Han, Title: Polysilicon Channel TFT With Separated Double-Gate for Unified RAM (URAM)—Unified Function for Nonvolatile SONOS Flash and High-Speed Capacitorless 1T-DRAM, IEEE Transactions on Electron Devices, vol. 57, No. 3, Mar. 2010.
G. Van den bosch, Title: Highly Scaled Vertical Cylindrical SONOS Cell With Bilayer Polysilicon Channel for 3-D NAND Flash Memory, IEEE Electron Device Letters, vol. 32, No. 11, Nov. 2011.
Po Hsieh Lin, Title of Invention: Semiconductor Device and Fabrication Method Thereof, U.S. Appl. No. 15/296,922, filed Oct. 18, 2016.

\* cited by examiner

MEMORY DEVICE

BACKGROUND OF THE INVENTION

1. Field of the Invention

The invention relates to a memory device, and more particularly to a flash memory.

2. Description of the Prior Art

A flash memory is a type of non-volatile memory, which can preserve data within the memory even when an external power supply is off. Recently, because flash memories are electrically re-writable and electrically re-erasable, they have been widely applied in the fabrication of electrical products, such as mobile phones, digital cameras, video players, personal digital assistants (PDA) or systems on a chip (SOC).

However, conventional flash memory typically uses a single tunnel oxide layer to carry out programming and erase operations, which not only affects the operation speed of the entire memory cell but also decreases endurance and life expectancy of the device. Hence, how to alter the architecture and operation means of current flash memory thereby improving the endurance of the device has become an important task in this field.

SUMMARY OF THE INVENTION

According to a first embodiment of the present invention, a memory device is disclosed. The memory device includes: a substrate; a channel layer on the substrate, in which the channel layer includes a T-shape having a horizontal portion with a first end and a second end and a vertical portion having a third end; a gate structure on a side of the vertical portion; an oxide-nitride-oxide (ONO) layer between the gate structure and the vertical portion; a source region on the first end of the horizontal portion; and a drain region on the third end of the vertical portion.

According to a second embodiment of the present invention, a memory device is disclosed. The memory device includes: a substrate; a channel layer on the substrate, in which the channel layer includes a T-shape having a horizontal portion with a first end and a second end and a vertical portion having a third end; a gate structure on a side of the vertical portion; a source region on the first end of the horizontal portion; a drain region on the third end of the vertical portion; and a doped region on the second end of the horizontal portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
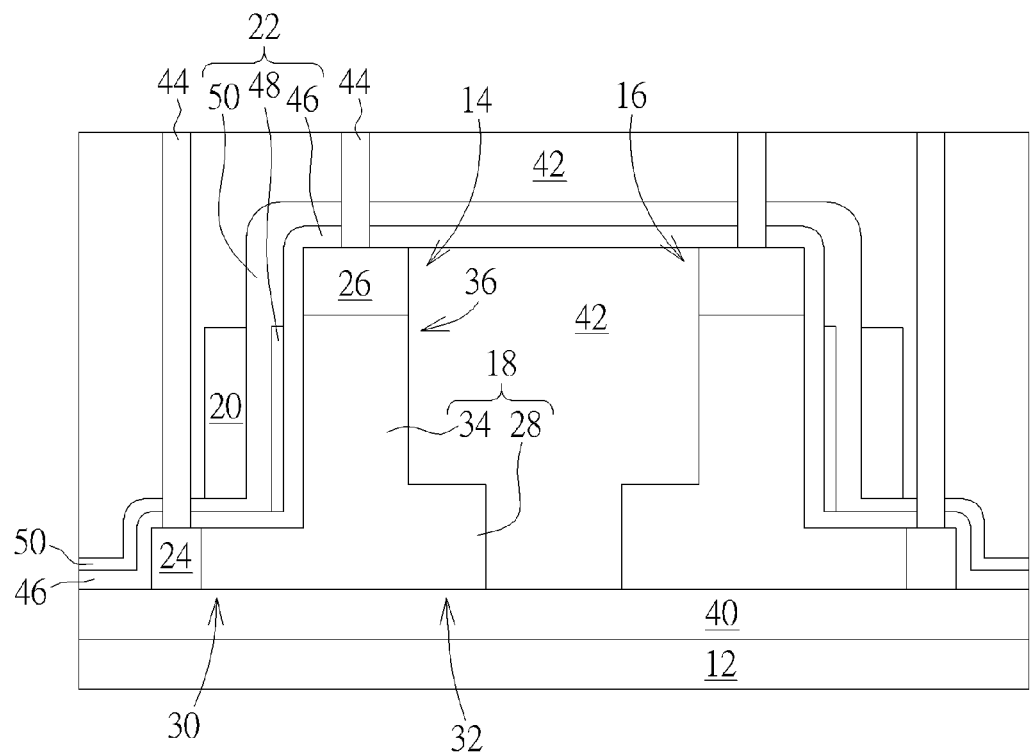
FIG. 1 illustrates a structural view of a vertical channel unified random access memory (URAM) according to a first embodiment of the present invention.

Referring to FIG. 1, FIG. 1 illustrates a structural view of a memory device, and more particularly to a vertical channel unified random access memory (URAM) according to a first embodiment of the present invention. As shown in FIG. 1, the memory device of this embodiment preferably includes a substrate 12 and two vertical channel URAMs 14, 16 disposed on the substrate 12. Preferably, the substrate 12 includes a semiconductor substrate or a silicon-on-insulator (SOI) substrate, the two URAMs 14, 16 could be fabricated at the same time and both URAMs 14, 16 could be worked independently in a cell array.

Preferably, each of the URAMs 14, 16 includes a channel layer 18 on the substrate 12, a gate structure 20 on a side of the channel layer 18, an oxide-nitride-oxide (ONO) layer 22 containing an oxide layer 46, a nitride layer 48, and another oxide layer 50 between the gate structure 20 and the channel layer 18, a source region 24 on one end of the channel layer 18, and a drain region 26 on another end of the channel layer 18. More specifically, the channel layer 18 includes a T-shape or a reverse T-shape in particularly, in which the reverse T-shape further includes a horizontal portion 28 having a first end 30 and a second end 32 and a vertical portion 34 having a third end 36. Preferably, the gate structure 20 is disposed on a side of the vertical portion 34, the oxide-nitride-oxide (ONO) layer 22 is disposed between the gate structure 20 and the vertical portion 34, the source region 24 is formed on the first end 30 of the horizontal portion 28, and the drain region 26 is formed on the third end 36 of the vertical portion 34. The second end 32 of the horizontal portion 28 preferably serves as an additional charge storage region for storing charges. It should be noted that even though the source region 24 is described as being formed on the first end 30 and the drain region 26 is formed on the third end 36 in this embodiment, the source region 24 could also be described as within the first end 30 and the drain region 26 could be described within the third end 36 since the two regions 24, 26 are essentially formed by implanting dopants into a semiconductor layer (not shown) which is then defined into the channel layer 18 and the source region 24 and drain region 26.

Viewing from an even more detailed perspective, the first end and the second end 32 of the horizontal portion 28 are non-symmetrical. For instance, a top surface of the second end 32 is higher than a top surface of the first end 30 while the second end 32 could also be higher than, equal to, or slightly lower than a bottom surface of the gate structure 20. The top surface of the gate structure 20 is preferably even to or slightly lower than a top surface of the vertical portion 34 or the bottom surface of the drain region 26, and an edge or sidewall of the gate structure 20 is aligned with an edge of the source region 24.

In this embodiment, the channel layer 18 is preferably made of semiconductor material such as silicon, the gate structure 20 is made of polysilicon, and the source region 24 and the drain region 26 could include either n-type dopants or p-type dopants depending on the demand of the product.

In addition to the aforementioned elements, the memory device also includes a buried layer 40 between the horizontal portion 28 of the channel layer 18 and the substrate 12, a dielectric layer 42 on the gate structure 20 and the channel layer 18, and contact plugs 44 within the dielectric layer 42 and electrically connected to the source region 24 and the drain region 26. The second end 32 of the channel layer 18 however remains floating and not connected to any of the contact plugs 44. Preferably, the dielectric layer 42 is formed on and contact the buried layer 40, the channel layer 18, the ONO layer 22, and the gate structure 20. In this embodiment, both the buried layer 40 and the dielectric layer 42 preferably include silicon oxide, but not limited thereto. Each of the contact plugs 44 could further include a barrier layer and a metal layer, in which the barrier layer could be selected from the group consisting of Ti, TiN, Ta, and TaN and the metal layer could be selected from the group consisting of W, Cu, Al, TiAl, and CoWP.

It is to be noted that the URAM of this embodiment could operate as a nonvolatile memory such as silicon-oxide-nitride-oxide-silicon (SONOS) device or a one-transistor dynamic random access memory (1T-DRAM) depending on the demand of the product, in which the operation mechanism typically includes a program operation and an erase operation. For instance, during a program operation mode while using as a SONOS device, electrons are accelerated by highly biased drain and attracted by highly biased gate so that the electrons would become trapped within the nitride layer 48 of the ONO layer 22, whereas during an erase operation mode, negatively biased gate is used to attract the hot holes injected into the nitride layer 48 and recombine with the electrons.

During a program operation mode while using as a 1T-DRAM, majority of the holes generated by implant ionization are accumulated in the second end 32 of the horizontal portion 28 of the channel layer 18, and during an erase operation mode, holes accumulated in the above zone are preferably moved to the drain region 26.

Overall, the vertical channel URAM of the this embodiment could not only be working as a non-volatile memory as well as a 1T-DRAM at the same time, but also provide advantages including larger memory window, better non-volatile memory data retention performance, and better 1T-DRAM performance with less soft error issue.

Figure 2:
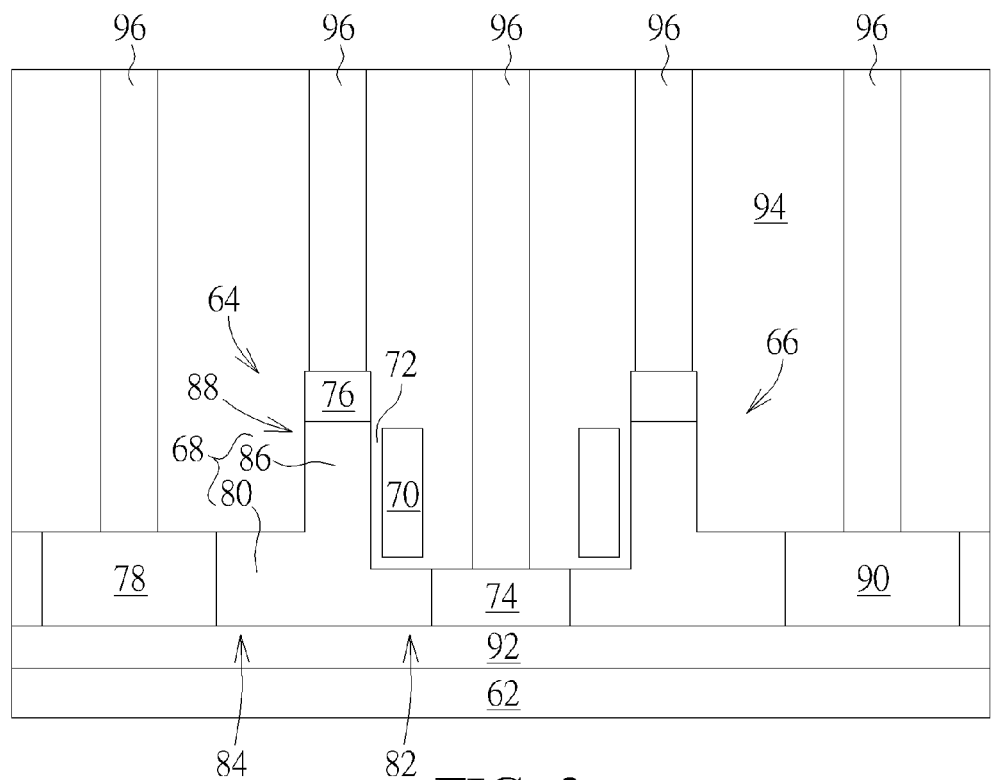
FIG. 2 illustrates a structural view of a vertical channel one-transistor static random access memory (1T-SRAM) according to a second embodiment of the present invention.

Referring to FIG. 2, FIG. 2 illustrates a structural view of a memory device, and more particularly to a vertical channel one-transistor static random access memory (1T-SRAM) according to a second embodiment of the present invention. As shown in FIG. 2, the memory device preferably includes a substrate 62 and two vertical channel 1T-SRAMs 64, 66 disposed on the substrate 62, in which the substrate 62 includes a semiconductor substrate or a silicon-on-insulator (SOI) substrate and the two 1T-SRAMs 64, 66 could be fabricated at the same time.

Preferably, each of the 1T-SRAMs 64, 66 includes a channel layer 68 on the substrate 62, a gate structure 70 on a side of the channel layer 68, a gate dielectric layer 72 between the gate structure 70 and the channel layer 68, a source region 74 on one end of the channel layer 68, a drain region 76 on another end of the channel layer 68, and a doped region 78 such as a well on yet another end of the channel layer 68. More specifically, the channel layer 68 includes a T-shape or a reverse T-shape in particularly, in which the reverse T-shape further includes a horizontal portion 80 having a first end 82 and a second end 84 and a vertical portion 86 having a third end 88. Preferably, the gate structure 70 is disposed on a side of the vertical portion 86, the gate dielectric layer 72 is disposed between the gate structure 70 and the vertical portion 86, the source region 74 is formed on the first end 82 of the horizontal portion 80, the drain region 76 is formed on the third end 88 of the vertical portion 86, and the doped region 78 is formed on the second end 84 of the horizontal portion 80.

It should be noted that the source region 74 for the 1T-SRAM 64 on the left also serves as the source region for the 1T-SRAM 66 on the right, the doped region 78 for the 1T-SRAM 64 on the left also serves as a common doped region for another 1T-SRAM (not shown) on the left of the 1T-SRAM, and the doped region 90 for the 1T-SRAM 66 on the right also serves as a common doped region for another 1T-SRAM (not shown) on the right of the 1T-SRAM 66. In other words, there is no isolation structures such as shallow trench isolations (STI) separating the 1T-SRAMs 64, 66 from each other, and the 1T-SRAMs 64, 66 are physically connected to each other through common doped regions and common source regions.

Viewing from an even more detailed perspective, the first end and the second end 84 of the horizontal portion 80 are non-symmetrical. For instance, a top surface of the second end 84 is higher than a top surface of the first end 82 while the second end 84 is higher than the bottom surface of the gate structure 70 so that an additional charge storage zone or region is created. The top surface of the gate structure 70 is preferably even to or slightly lower than a top surface of the vertical portion 86 or the bottom surface of the drain region 76, and an edge or sidewall of the gate structure 70 is aligned with an edge of the source region 74.

In this embodiment, the gate dielectric layer 72 is made of silicon oxide, the channel layer 68 is made of silicon, and the gate structure 70 is made of polysilicon. The source region 74, the drain region 76, and the doped region 78 are preferably formed with dopants with same conductive type, such as n-type dopants in this embodiment. Nevertheless, the three regions 74, 76, 78 could also be formed with p-type dopants depending on the demand of the product, which is also within the scope of the present invention.

In addition to the aforementioned elements, the memory device also includes a buried layer 92 between the horizontal portion 82 of the channel layer 68 and the substrate 62, a dielectric layer 94 on the gate structure 70 and the channel layer 68, and contact plugs 96 within the dielectric layer 94 and electrically connected to the source region 74, the drain regions 76, and the doped regions 78 and 90. Preferably, the dielectric layer 94 is formed on and contacting the doped regions 78 and 90, the channel layer 68, the gate dielectric layer 72, and the gate structure 70. In this embodiment, both the buried layer 92 and the dielectric layer 72 preferably include silicon oxide, but not limited thereto. Each of the contact plugs 96 could further include a barrier layer and a metal layer, in which the barrier layer could be selected from the group consisting of Ti, TiN, Ta, and TaN and the metal layer could be selected from the group consisting of W, Cu, Al, TiAl, and CoWP.

Preferably, the operation mechanism of the 1T-SRAM could be achieved in a similar manner as a conventional 1T-DRAM. For instance, during a write "1" operation, a large bias voltage is applied to the doped region 78 or buried n-well adjacent to the additional charge storage region on the second end 84 of horizontal portion 80 of channel layer 68, and as electrons are attracted upward toward the drain region 76, holes are attracted downward and stored in the floating p-well region of the additional charge storage region while the voltage potential is increased in the p-well. This helps to turn on the horizontal bipolar junction transistor (BJT) constituted by the buried n-well 78, the channel layer 68, and the source region 74 to initiate an impact ionization. By doing so, electrons are moved across the horizontal portion 80 of the channel layer 68 to the source region 74 or ground to create a current and to cope with this action, holes are replenished constantly from the additional charge storage region to the source region 74 to pair with the electrons.

Nevertheless, it should be noted that the operation mechanism of this embodiment differs from the conventional 1T-DRAM in that a common doped region 78 or buried n-well is provided to constantly replenish the holes, whereas no such region is present in the conventional 1T-DRAM.

During a write "0" operation, no holes are generated and the voltage potential in the p-well or channel region is nearly zero. This turns off the horizontal BJT and inhibits the occurrence of an impact ionization. In other words, although the buried n-well 78 is used, low voltage potential in the channel region acts as a barrier so that no carriers are able to move across the channel region.

Overall, the vertical channel 1T-SRAM of this embodiment could not only work as a conventional 6T-SRAM by using only one transistor but also provide the following advantages. First, it would be desirable to reduce approximately 80% of device by using the aforementioned structure having common source region and buried n-well structures. Secondly, since only one channel is present, there is only one interval leakage path involved in the aforementioned 1T-SRAM structure as opposed to having four leakage paths in the conventional 6T-SRAM. Thirdly, additional charge storage region adjacent to the buried n-well is disclosed to increase overall storage amount and enlarge the gap between state "1" and state "0". Lastly, no isolation process is needed to form isolation structures between devices as the devices are automatically isolated by the high bias of buried n-well and low bias of ground (such as the source region).

Figure 3:
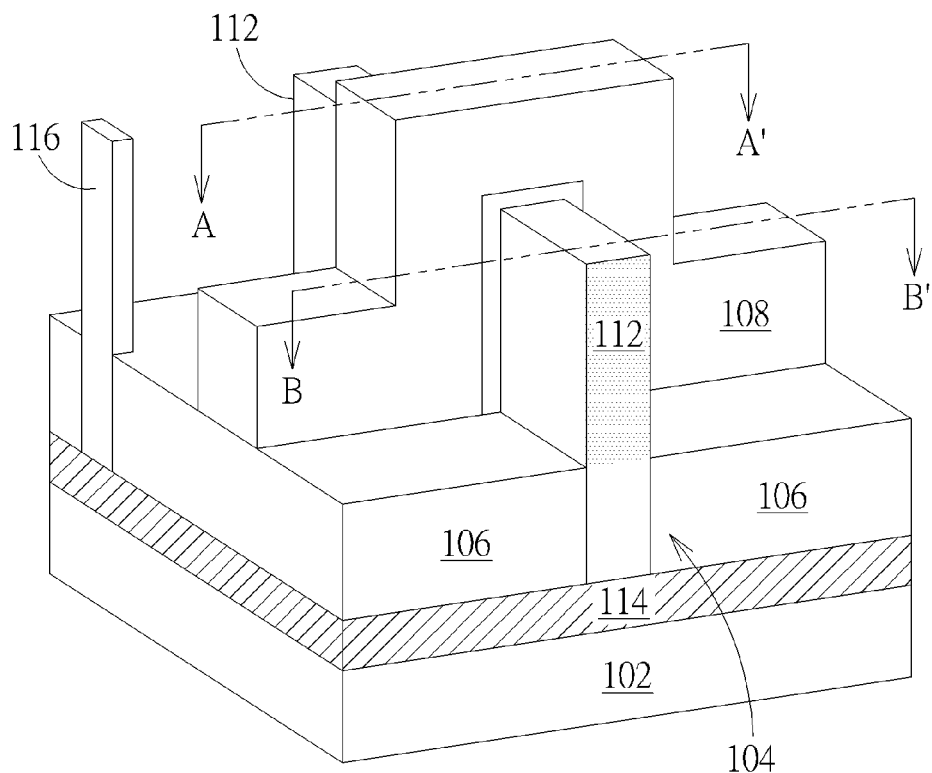
FIG. 3 illustrates a three-dimensional view of a FinFET-based 1T-SRAM according to an embodiment of the present invention.
Figure 4:
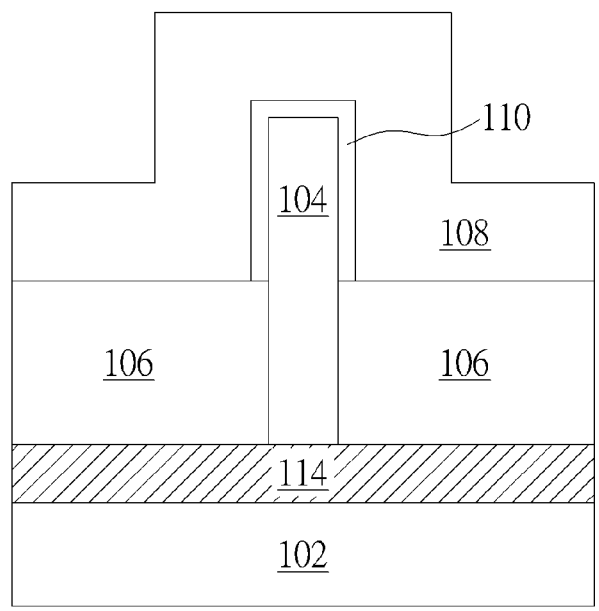
FIG. 4 illustrates a cross-section of FIG. 3 along the sectional line AA'.
Figure 5:
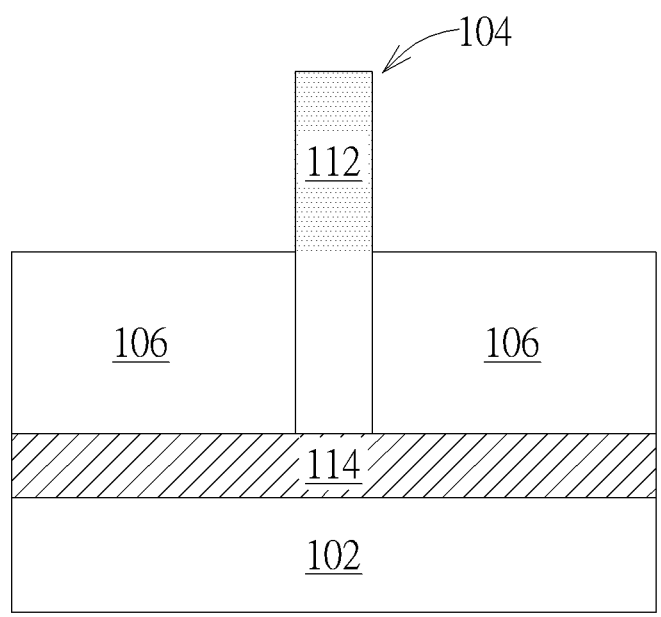
FIG. 5 illustrates a cross-section of FIG. 3 along the sectional line BB'.

Referring to FIGS. 3-5, FIGS. 3-5 illustrate structural views of a memory device, and more particularly to a FinFET-based one-transistor static random access memory (1T-SRAM) according to an embodiment of the present invention, in which FIG. 3 illustrates a three-dimensional view of the FinFET-based 1T-SRAM, FIG. 4 illustrates a cross-section of FIG. 3 along the sectional line AA' and FIG. 5 illustrates a cross-section of FIG. 3 along the sectional line BB'. As shown in FIGS. 3-5, the FinFET-based 1T-SRAM includes a substrate 102, a fin-shaped structure 104 on the substrate 102, a shallow trench isolation (STI) 106 on the substrate 102 and around the fin-shaped structure 104, a gate structure 108 standing astride the fin-shaped structure 104, a gate dielectric layer 110 between the gate structure 108 and the fin-shaped structure 104, and a source/drain region 112 adjacent to two sides of the gate structure 108.

In this embodiment, the FinFET-based 1T-SRAM also includes a buried n-well 114 formed under the channel region of the device so that a bipolar junction transistor could be created at the bottom of the FinFET to achieve similar operation as a 1T-SRAM. Preferably, the concentration of the buried n-well 114 is preferably between $1\times10^{18}$ cm$^3$ to $5\times10^{18}$ cm$^3$, and a contact plug 116 could be formed in the STI 106 to electrically connect to the buried n-well 114.

Overall, the FinFET-based 1T-SRAM of this embodiment preferably provides the following advantages:
1. In contrast to the conventional 6T-SRAM, the overall area of the FinFET-based 1T-SRAM could be reduced by approximately 80%. This provides an advantage of having not only lowered cost but also more flexibility for designers in circuit design.
2. In contrast to the conventional 6T-SRAM device of having at least 4 leakage paths, there is only one possible leakage path in the FinFET-based 1T-SRAM of the present invention. This provides an advantage of having flexible adjustment for other parameters and threshold voltages for the device.
3. Since the carriers are now stored directly under the channel region of the device, there will be no extra needs for more area.
4. By using an architecture of having deepened channel region for the device, it would be possible to increase the capacity for storing charges thereby obtaining greater window for programming.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory device, comprising:
   a substrate;
   a channel layer on the substrate, wherein the channel layer comprises a T-shape, and the T-shape comprises a horizontal portion having a first end and a second end and a vertical portion having a third end;
   a buried layer between the horizontal portion and the substrate;
   a gate structure on a side of the vertical portion;
   an oxide-nitride-oxide (ONO) layer between the gate structure and the vertical portion;
   a source region on the first end of the horizontal portion; and
   a drain region on the third end of the vertical portion.
2. The memory device of claim 1, wherein the buried layer comprises silicon oxide.
3. The memory device of claim 1, further comprising a dielectric layer on and contact the buried layer, the channel layer, the ONO layer, and the gate structure.
4. The memory device of claim 3, wherein the dielectric layer comprises silicon oxide.
5. The memory device of claim 1, wherein the first end and the second end of the horizontal portion are non-symmetrical.
6. The memory device of claim 1, wherein a top surface of the second end is higher than a top surface of the first end.
7. The memory device of claim 1, wherein a top surface of the gate structure is lower than a top surface of the vertical portion.
8. The memory device of claim 1, wherein the channel layer comprises silicon.
9. The memory device of claim 1, wherein the gate structure comprises polysilicon.
10. A memory device, comprising:
    a substrate;
    a channel layer on the substrate, wherein the channel layer comprises a T-shape, and the T-shape comprises a horizontal portion having a first end and a second end and a vertical portion having a third end;
    a gate structure on a side of the vertical portion;
    a source region on the first end of the horizontal portion;
    a drain region on the third end of the vertical portion; and
    a doped region on the second end of the horizontal portion.
11. The memory device of claim 10, further comprising a buried layer between the horizontal portion and the substrate.
12. The memory device of claim 11, wherein the buried layer comprises silicon oxide.
13. The memory device of claim 11, further comprising a dielectric layer on and contact the channel layer, the ONO layer, and the gate structure.

14. The memory device of claim 13, wherein the dielectric layer comprises silicon oxide.

15. The memory device of claim 10, wherein the first end and the second end of the horizontal portion are non-symmetrical.

16. The memory device of claim 10, wherein a top surface of the second end is higher than a top surface of the first end.

17. The memory device of claim 10, wherein a top surface of the gate structure is lower than a top surface of the vertical portion.

18. The memory device of claim 10, wherein the channel layer comprises silicon.

19. The memory device of claim 10, wherein the gate structure comprises polysilicon.

20. A memory device, comprising:
   a substrate;
   a channel layer on the substrate, wherein the channel layer comprises a T-shape, the T-shape comprises a horizontal portion having a first end and a second end and a vertical portion having a third end, and a top surface of the second end is higher than a top surface of the first end;
   a gate structure on a side of the vertical portion;
   an oxide-nitride-oxide (ONO) layer between the gate structure and the vertical portion;
   a source region on the first end of the horizontal portion; and
   a drain region on the third end of the vertical portion.

* * * * *